(12) United States Patent
Lai et al.

(10) Patent No.: US 9,281,713 B2
(45) Date of Patent: Mar. 8, 2016

(54) SYSTEM AND METHOD FOR ELECTRICITY MANAGEMENT

(71) Applicant: LITE-ON CLEAN ENERGY TECHNOLOGY CORP., Taipei (TW)

(72) Inventors: Chiou-Chu Lai, Taipei (TW); Ming-Yao Cheng, Taipei (TW); Chien-Chu Chen, Taipei (TW)

(73) Assignee: LITE-ON TECHNOLOGY CORPORATION, Taipei (TW)

( * ) Notice: Subject to any disclaimer, the term of this patent is extended or adjusted under 35 U.S.C. 154(b) by 582 days.

(21) Appl. No.: 13/729,899

(22) Filed: Dec. 28, 2012

(65) Prior Publication Data

US 2014/0097681 A1   Apr. 10, 2014

(30) Foreign Application Priority Data

Oct. 4, 2012 (TW) .............................. 101136728 A

(51) Int. Cl.
*H02J 9/00* (2006.01)
*G01R 31/40* (2014.01)

(52) U.S. Cl.
CPC . *H02J 9/00* (2013.01); *G01R 31/40* (2013.01); *Y10T 307/344* (2015.04)

(58) Field of Classification Search
None
See application file for complete search history.

(56) References Cited

U.S. PATENT DOCUMENTS

| 5,117,324 A | 5/1992 | Johnson, Jr. |
| 5,295,078 A | 3/1994 | Stich et al. |
| 5,458,991 A | 10/1995 | Severinsky |
| 6,031,354 A | 2/2000 | Wiley et al. |
| 6,236,226 B1 * | 5/2001 | Hagiwara ................ 324/764.01 |
| 2004/0128562 A1 | 7/2004 | Bigelow et al. |

FOREIGN PATENT DOCUMENTS

TW   253579   8/1995

* cited by examiner

*Primary Examiner* — Jared Fureman
*Assistant Examiner* — Aqeel Bukhari
(74) *Attorney, Agent, or Firm* — Muncy, Geissler, Olds & Lowe, P.C.

(57) ABSTRACT

A system and a method for electricity management are disclosed. The system includes a data management unit, a cabinet, a control unit, an uninterruptible power supply apparatus and a power switch. The cabinet is powered by an external power supply. When the data management unit sends a testing instruction to the cabinet, the control unit controls the power switch to shut down the external power supply such that the cabinet is powered by the uninterruptible power supply apparatus instead. The control unit measures a set of battery parameters of the uninterruptible power supply apparatus, computes a power supply capacity of the uninterruptible power supply apparatus according to the set of battery parameters, and returns the power supply capacity to the data management unit.

14 Claims, 2 Drawing Sheets

SYSTEM AND METHOD FOR ELECTRICITY MANAGEMENT

BACKGROUND OF THE INVENTION

1. Field of the Invention

The present invention relates to a system and a method for electricity management, and more particularly, to a system and a method for electricity management used to test an uninterruptible power supply apparatus.

2. Description of the Related Art

With the booming development of the information industry in recent years, a variety of hardware equipment, such as personal computers, communication equipment, and workstations, is broadly applied in all strata of society. As information itself is a high value-added product, people try every means to ensure the security of information and the normal operation of computer systems, so the requirement for a power supply with consistent quality has become stricter. While electronic power equipment has been heavily used, the derived harmonic waves may result in poor-quality electricity, and factors such as natural disasters, all make it impossible for electricity providers to guarantee a stable power supply with high quality. Thus, an uninterruptible power supply (UPS) becomes an indispensable device for computers or communication systems, and how to effectively test the function of the uninterruptible power supply system also becomes an important issue.

The common practice of testing the function of an uninterruptible power supply system is to discharge electricity with electronic load equipment (Loader) after removing part of the batteries in the system, and then installing them back into the system after the capacity of the other batteries has been measured and the removed batteries have been fully recharged. The reason that only part of the batteries is removed for testing is to avoid a blackout during the testing. Such a method results in shortcomings include: manpower to be allocated to battery disassembly/assembly, the expense of the discharge/recharge equipment required during the testing process builds up an increased cost structure, and moreover, an estimate of the available service time during the blackout calculated based on the discharging capacity discharged through a discharge machine may be inaccurate and unreliable. In addition, the electricity discharged during the testing conducted by the conventional testing method indicates a total waste of energy. Therefore, it is necessary to provide an electricity management system and electricity management method for testing a UPS system periodically and automatically so as to manage the status of the uninterruptible power supply system, furthermore, to control the risk of power blackout efficiently in an attempt to eliminate the shortcomings of the prior art.

SUMMARY OF THE INVENTION

It is an object of the present invention to provide an electricity management system.

It is another object of the present invention to provide an electricity management method.

In order to achieve the aforementioned objects, according to one embodiment of the present invention, the electricity management system of the present invention includes a data management unit, at least one cabinet, at least one control unit, at least one uninterruptible power supply apparatus and at least one power switch. Every cabinet includes at least one electronic equipment, respectively, and the at least one cabinet is powered by an external power supply. The data management unit is electrically connected with the at least one cabinet, wherein the data management unit is used to configure a testing instruction and send the testing instruction to the at least one cabinet, in addition, the data management unit can arrange a testing schedule for every cabinet and conduct the testing automatically according to the testing schedule. The at least one uninterruptible power supply apparatus is electrically connected with the at least one control unit and the at least one cabinet, respectively. The at least one power switch is electrically connected with the at least one control unit and the external power supply, respectively. Through the aforementioned structure, when the data management unit sends the testing instruction to the at least one cabinet, the at least one control unit controls the at least one power switch to shut down the external power supply to the at least one cabinet, and the at least one cabinet is powered by the at least one uninterruptible power supply apparatus instead; in addition, the at least one control unit measures a set of battery parameters of the at least one uninterruptible power supply apparatus, computes a power capacity of the at least one uninterruptible power supply apparatus according to the set of battery parameters, and returns the power capacity to the data management unit.

According to one embodiment of the present invention, the data management unit is further used to determine if the power capacity is less than a default capacity, and if the power supply capacity is less than the default capacity, it then configures a service power during a blackout for the at least one cabinet.

According to one embodiment of the present invention, the testing instruction includes a service power, wherein the at least one cabinet operates with the service power.

According to one embodiment of the present invention, the testing instruction further includes a termination condition, and the at least one control unit functions in accordance with the termination condition to control the at least one power switch to turn on the external power supply to power the at least one cabinet instead of the at least one uninterruptible power supply apparatus.

According to one embodiment of the present invention, the termination condition includes whether the operation voltage of the at least one uninterruptible power supply apparatus is lower than a default voltage, whether the operation time of the at least one uninterruptible power supply apparatus exceeds a default time, or whether the amount of power supplied by the at least one uninterruptible power supply apparatus exceeds a default value of power supplied.

According to one embodiment of the present invention, the set of battery parameters includes voltage data, electric current data, and temperature data.

According to one embodiment of the present invention, the electronic equipment can be at least one hard disc, at least one server, or a combination of at least one hard disc and at least one server.

According to one embodiment of the present invention, the electricity management method is used in the electricity management system, wherein the electricity management system includes a data management unit, at least one cabinet, at least one control unit, at least one uninterruptible power supply apparatus and at least one power switch. Each cabinet includes at least one electronic equipment, respectively. The at least one cabinet is powered by an external power supply. The data management unit is electrically connected with the at least one cabinet. The at least one uninterruptible power supply apparatus is electrically connected with the at least one control unit and the at least one cabinet, respectively. The at least one power switch is electrically connected with the at least one control unit and the external power supply, respectively. The electricity management method includes: using the data management unit to configure a testing instruction and send the testing instruction to the at least one cabinet; using the at least one control unit to control the at least one power switch to shut down the external power supply such that the at least one cabinet is powered by the at least one uninterruptible power supply apparatus instead; using the at least one control unit to measure a set of battery parameters of the at least one uninterruptible power supply apparatus, and through the at least one control unit to compute a power capacity of the at least one uninterruptible power supply apparatus according to the set of battery parameters and to return the power capacity to the data management unit.

According to one embodiment of the present invention, the electricity management method further includes: using the data management unit to determine whether the power capacity is less than a default capacity, if the power capacity is less than the default capacity, using the data management unit to configure a service power during a blackout for the at least one cabinet.

According to one embodiment of the present invention, the testing instruction includes a service power, and the at least one cabinet operates with the service power.

According to one embodiment of the present invention, the testing instruction further includes a termination condition, wherein the at least one control unit further controls the at least one power switch, according to the termination condition, to turn on the external power supply to power the at least one cabinet such that the at least one uninterruptible power supply apparatus no longer supplies the at least one cabinet with power.

According to one embodiment of the present invention, the termination condition includes whether the operation voltage of the at least one uninterruptible power supply apparatus is lower than a default voltage, whether the operation time of the at least one uninterruptible power supply apparatus exceeds a default time, or whether the amount of power supplied by the at least one uninterruptible power supply apparatus exceeds a default value of power supplied.

According to one embodiment of the present invention, the set of battery parameters includes voltage data, electric current data, and temperature data.

According to one embodiment of the present invention, the electronic equipment can be at least one hard disc, at least one server, or a combination of at least one hard disc and at least one server.

Other objects, advantages, and novel features of the invention will become more apparent from the following detailed description when taken in conjunction with the accompanying drawings.

BRIEF DESCRIPTION OF THE DRAWINGS

These and other objects and advantages of the present invention will become apparent from the following description of the accompanying drawings, which disclose several embodiments of the present invention. It is to be understood that the drawings are to be used for purposes of illustration only, and not as a definition of the invention.

In the drawings, wherein similar reference numerals denote similar elements throughout the several views.

DETAILED DESCRIPTION OF THE PREFERRED EMBODIMENT

The aforementioned objects, characteristics, and advantages of the present invention will become more apparent from the following detailed descriptions of a concrete embodiment when taken together with the accompanying drawings.

Figure 1:
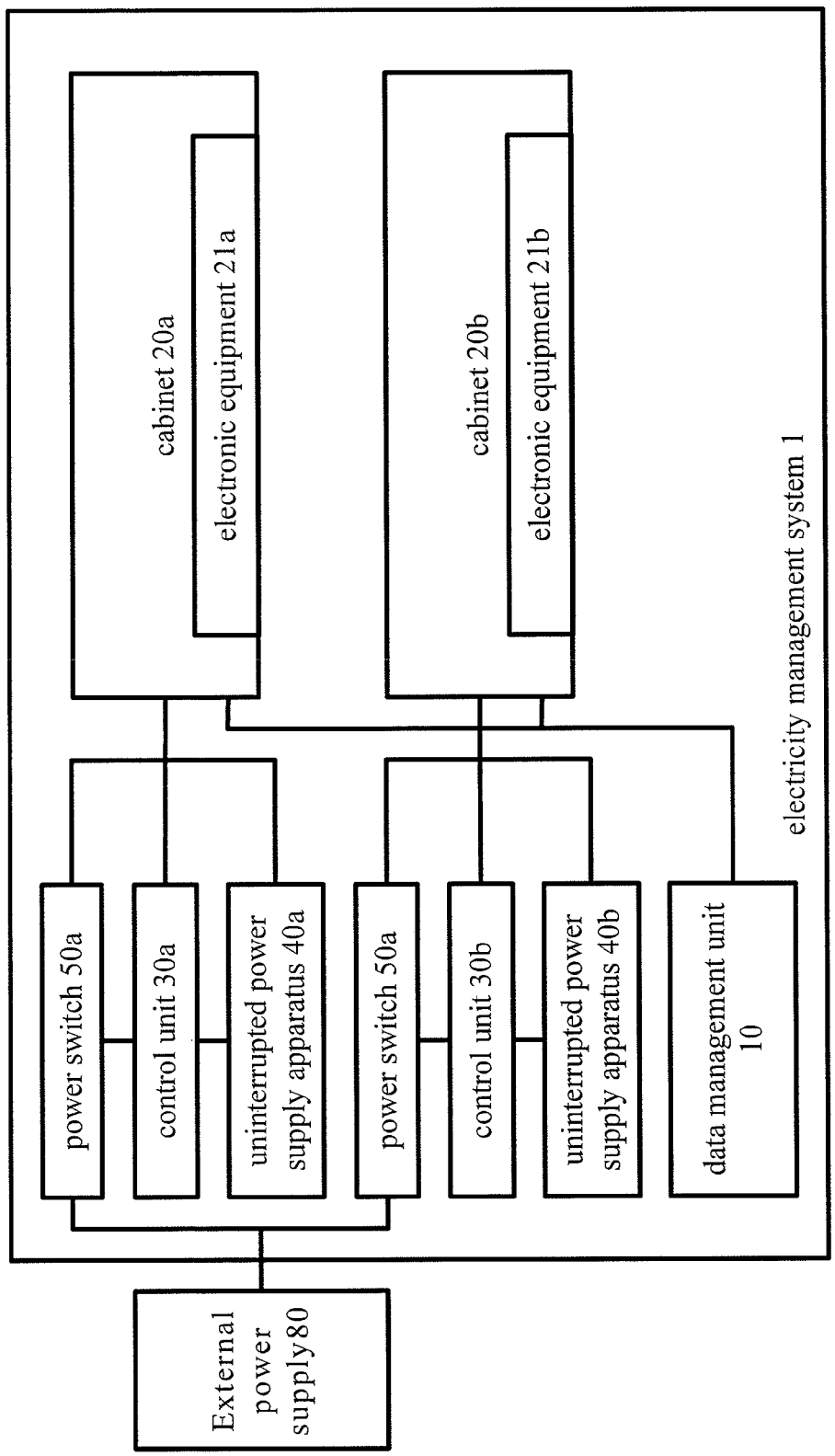
FIG. 1 is a system architecture diagram illustrating the electricity management system according to one embodiment of the present invention.

Please refer to FIG. 1 first, which is a system architecture diagram of the electricity management system 1 according to one embodiment of the present invention. As shown in FIG. 1, according to one embodiment of the present invention, the electricity management system 1 of the present invention includes a data management unit 10, cabinets 20a and 20b, control units 30a and 30b, uninterruptible power supply apparatuses 40a and 40b, and power switches 50a and 50b. The outside of the electricity management system 1 has an external power supply 80 connected with the power switches 50a and 50b, to supply power to the cabinets 20a, 20b. What should be noted is that every aforementioned element not only can be disposed as a hardware apparatus, a software program, a firmware, or any such combination, but also can be disposed through a circuit loop or any appropriate type. Furthermore, every element can be disposed as an independent type as well as any combined type. The present embodiment exemplifies only a good embodiment of the present invention; not all possible combinations are described in detail. Nevertheless, those skilled in the art should understand that the aforementioned elements are not all necessary. In order to present an embodiment of the present invention, it is also possible to include other detailed elements of the prior art. Any element can be omitted or modified depending on requirements, and other elements may exist between any two elements.

According to one embodiment of the present invention, the electricity management system 1 allows a user to conduct a functionality testing of the uninterruptible power supply apparatus. The data management unit 10 is electrically connected with the cabinets 20a, 20b; when a user wants to conduct a testing, the data management unit 10 can configure a testing instruction and send the testing instruction to the cabinet 20a or 20b to begin the testing. The cabinets 20a and 20b are disposed with an electronic equipment 21a and 21b, respectively, which the electronic equipment 21a and 21b can be a hard disc, a server or a combination of both, but the present invention is not limited to this disposition.

According to one embodiment of the present invention, the control units 30a and 30b are electrically connected with the cabinets 20a and 20b, respectively, and the uninterruptible power supply apparatuses 40a and 40b are electrically connected with the control units 30a and 30b and with the cabinets 20a and 20b, respectively. By these connections, the control units 30a and 30b can measure a set of battery parameters of the uninterruptible power supply apparatuses 40a and 40b. The power switches 50a and 50b are electrically connected with the control units 30a and 30b respectively and with the external power supply 80. By these connections, the control units 30a and 30b can control the power switches 50a and 50b to shut down the external power supply 80, and the cabinets 20a and 20b can be powered by the uninterruptible power supply apparatuses 40a and 40b instead, thus to test the uninterruptible power supply apparatuses 40a and 40b.

Also to be noted is that the electricity management system 1 does not necessarily include only two sets of the cabinets 20a and 20b, the control units 30a and 30b, the uninterruptible power supply apparatuses 40a and 40b, and the power switches 50a and 50b. The number of the cabinets and other apparatuses can be increased or decreased depending on requirements.

Figure 2:
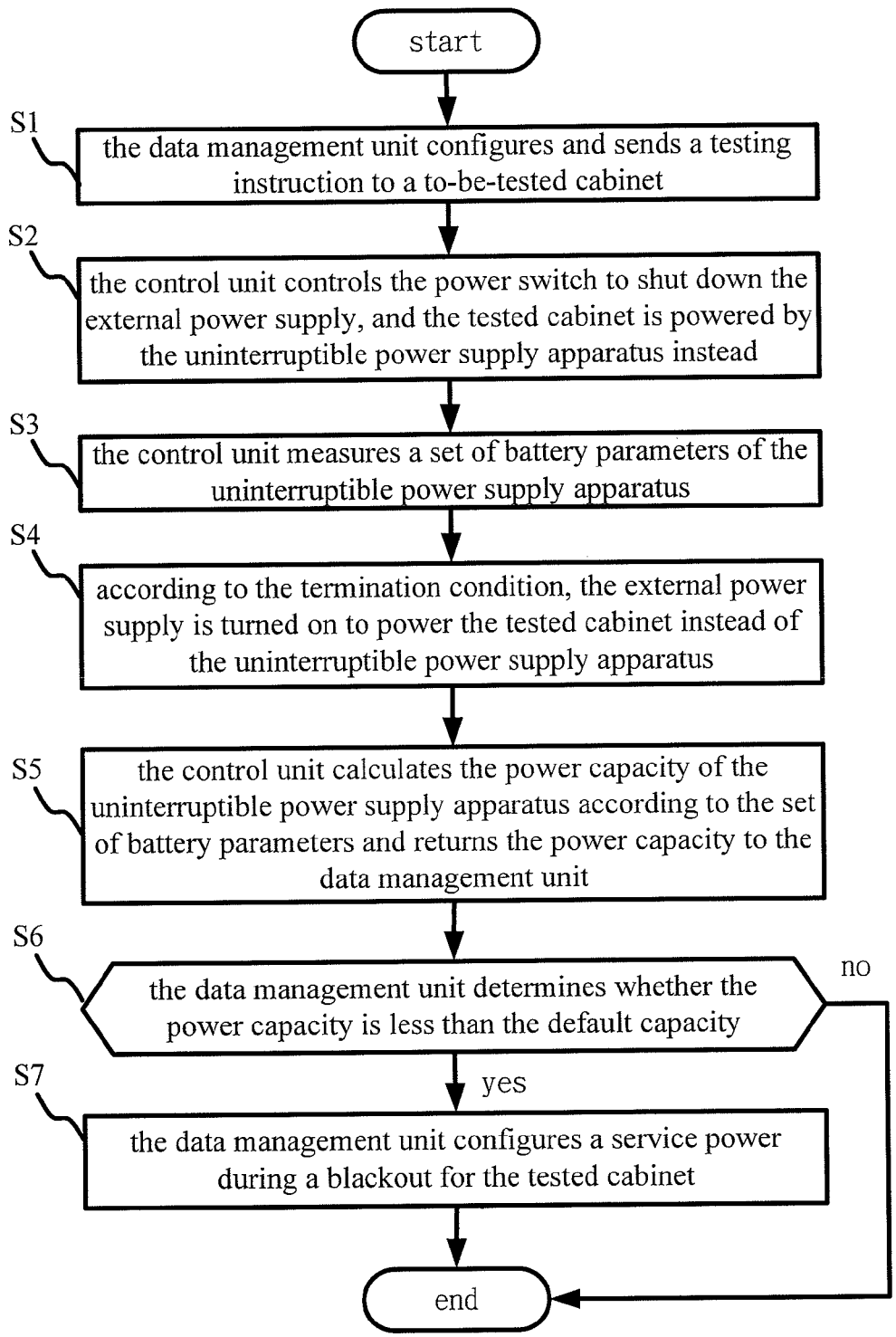
FIG. 2 is a procedure flow chart illustrating the electricity management method according to one embodiment of the present invention.

Please refer to FIG. 2, which is a procedure flow chart illustrating the electricity management method according to one embodiment of the present invention. The electricity management method of the present invention is described below using the electricity management system 1 shown in FIG. 1. What should be noted is that the electricity management method of the present invention is not confined to the usage of the electricity management system 1 shown in FIG. 1.

First of all, the system proceeds with step S1: the data management unit configures and sends a testing instruction to a to-be-tested cabinet.

Please refer to FIG. 1, when the user intends to conduct a testing on the uninterruptible power supply apparatus, the data management unit 10 configures a testing instruction and sends the testing instruction to the corresponding cabinet first. Generally speaking, the data management unit 10 can arrange a testing schedule of every cabinet and conduct tests automatically according to the testing schedule. In the present embodiment, for example, when the user wants to test the uninterruptible power supply apparatus 40a, the data management unit 10 sends the testing instruction to the corresponding cabinet 20a of the uninterruptible power supply apparatus 40a first.

According to one embodiment of the present invention, the testing instruction at least includes a service power to configure the service power used by the cabinet 20a during the testing process. The testing instruction can also include a termination condition, wherein the termination condition can include a default voltage, a default time or a default value of power supplied of the uninterruptible power supply apparatus 40a, such that when the operation voltage of the uninterruptible power supply apparatus 40a is lower than the default voltage, the operation time of the uninterruptible power supply apparatus 40a exceeds the default time, or the amount of power supplied by the uninterruptible power supply apparatus 40a exceeds the default value for power supplied, the testing is stopped. However, what should be noted is that the termination condition is not confined to these aspects.

Next, the system proceeds with step S2: the control unit controls the power switch to shut down the external power supply, and the tested cabinet is powered by the uninterruptible power supply apparatus instead.

According to one embodiment of the present invention, after the data management unit 10 sends the testing instruction to the cabinet 20a, the corresponding control unit 30a controls the power switch 50a to shut down the power supply from the external power supply 80 to the cabinet 20a. At the same time, the cabinet 20a is powered by the uninterruptible power supply apparatus 40a instead so as to start the testing process. Also to be noted is that the power switch 50a can be controlled by an independent element and not necessarily by the control unit 30a.

Next, the system proceeds with step S3: the control unit measures a set of battery parameters of the uninterruptible power supply apparatus.

According to one embodiment of the present invention, when the uninterruptible power supply apparatus 40a supplies power to the cabinet 20a, the control unit 30a continues measuring the uninterruptible power supply apparatus 40a to obtain a set of battery parameters of the uninterruptible power supply apparatus 40a. The set of battery parameters can include voltage data, electric current data and temperature data, but the present invention is not confined to this aspect. What should be noted is how the set of battery parameters of the uninterruptible power supply apparatus 40a is obtained is familiar to persons having ordinary skill in the art of the present invention, which falls into the scope of the prior art; therefore, it is not described in detail herein.

Next, the system proceeds with step S4: according to the termination condition, the external power supply is turned on to power the tested cabinet instead of the uninterruptible power supply apparatus.

According to one embodiment of the present invention, during the testing process of the uninterruptible power supply apparatus 40a, the control unit 30a continues to determine whether the termination condition is met. When the termination condition is met, the control unit 30a controls the power switch 50a to turn on the external power supply 80 to power the cabinet 20a instead of the uninterruptible power supply apparatus 40a.

Next, the system proceeds with step S5: the control unit calculates the power capacity of the uninterruptible power supply apparatus according to the set of battery parameters and returns the power capacity to the data management unit.

According to one embodiment of the present invention, after the uninterruptible power supply apparatus 40a stops supplying power to the cabinet 20a, the control unit 30a calculates the power capacity of the uninterruptible power supply apparatus 40a according to the measured battery parameters, and then returns the power capacity to the data management unit 10. What should be noted is that how the power capacity is calculated based on the battery parameters should be familiar to persons having ordinary skill in the art of the present invention, which falls into the scope of the prior art. Therefore, it is not described in detail herein.

Next, the system proceeds with step S6: the data management unit determines whether the power capacity is less than the default capacity.

According to one embodiment of the present invention, the data management unit 10 then determines whether the power capacity of the uninterruptible power supply apparatus 40a is less than a default capacity. If the power capacity is less than the default capacity, then the system proceeds with step S7; otherwise, the whole testing process is terminated.

Finally, the system proceeds with step S7: the data management unit configures a service power during a blackout for the tested cabinet.

During step S6, if the data management unit 10 determines that the power capacity of the uninterruptible power supply apparatus 40a is less than the default capacity, then the data management unit 10 configures a service power during a blackout for the cabinet 20a. The service power during a blackout can prevent the uninterruptible power supply apparatus 40a from supplying a greater amount of power to the cabinet 20a during a blackout, by doing so the power supply time of the uninterruptible power supply apparatus 40a can be extended to conform to the target time of the power supply.

What should be noted here is that the electricity management method of the present invention is not confined to the order of the aforementioned steps. The order of the aforementioned steps can also be changed as long as it achieves the objects of the present invention.

To sum up, the present invention has characteristics that are different from the prior art in terms of the objects, means, and function, and the present invention thus merits a patent. What should be noted is that the aforementioned embodiments are provided for illustration only, and not for the purpose of limiting the scope of the invention as defined by the appended claims.

What is claimed is:

1. An electricity management system, comprising:
   at least one cabinet, wherein every cabinet includes at least one electronic equipment, and the at least one cabinet is powered by an external power supply;
   a data management unit, which is electrically connected with the at least one cabinet, the data management unit being used to configure a testing instruction and send the testing instruction to the at least one cabinet;
   at least one control unit;
   at least one uninterruptible power supply apparatus, which is electrically connected with the at least one control unit and the at least one cabinet respectively; and
   at least one power switch, which is electrically connected with the at least one control unit and the external power supply, respectively;
   by means of the aforementioned structure, when the data management unit sends the testing instruction to the at least one cabinet, the at least one control unit controls the at least one power switch to shut down the power to the at least one cabinet from the external power supply and the at least one cabinet is powered by the at least one uninterruptible power supply apparatus instead, and the at least one control unit measures a set of battery parameters of the at least one uninterruptible power supply apparatus and calculates a power capacity of the at least one uninterruptible power supply apparatus according to the set of battery parameters, and returns the power capacity to the data management unit.

2. The electricity management system as claimed in claim 1, wherein the data management unit is further used to determine whether the power capacity is less than a default capacity, and if the power capacity is less than the default capacity, the data management unit configures a service power during a blackout for the at least one cabinet.

3. The electricity management system as claimed in claim 2, wherein the testing instruction includes a service power, and the at least one cabinet is operated with the service power.

4. The electricity management system as claimed in claim 3, wherein the testing instruction further includes a termination condition, the at least one control unit functions according to the termination condition to control the at least one power switch to turn on the external power supply to power the at least one cabinet instead of the at least one uninterruptible power supply apparatus.

5. The electricity management system as claimed in claim 4, wherein the termination condition includes whether the operation voltage of the at least one uninterruptible power supply apparatus is lower than a default voltage, whether the operation time of the at least one uninterruptible power supply apparatus exceeds a default time, or whether the amount of power supplied by the at least one uninterruptible power supply apparatus exceeds a default value of power supplied.

6. The electricity management system as claimed in claim 1, wherein the set of battery parameters includes voltage data, electric current data, and temperature data.

7. The electricity management system as claimed in claim 1, wherein the electronic equipment can be at least one hard disc, at least one server, or a combination of at least one hard disc and at least one server.

8. An electricity management method, which is used by an electricity management system, and the electricity management system includes a data management unit, at least one cabinet, at least one control unit, at least one uninterruptible power supply apparatus and at least one power switch, wherein every cabinet includes at least one electronic equipment, the at least one cabinet is powered by an external power supply, the data management unit is electrically connected with the at least one cabinet, the at least one uninterruptible power supply apparatus is electrically connected with the at least one control unit and the at least one cabinet, respectively, and the at least one power switch is electrically connected with the at least one control unit and the external power supply, respectively; the method comprising:
   by means of the data management unit, configuring a testing instruction and sending the testing instruction to the at least one cabinet;
   by means of the at least one control unit, controlling the at least one power switch to shut down the power to the at least one cabinet from the external power supply such that the at least one cabinet is powered by the at least one uninterruptible power supply apparatus instead;
   by means of the at least one control unit, measuring a set of battery parameters of the at least one uninterruptible power supply apparatus; and
   by means of the at least one control unit, calculating a power capacity of the at least one uninterruptible power supply apparatus according to the set of battery parameters and returning the power capacity to the data management unit.

9. The electricity management method as claimed in claim 8, further includes: by means of the data management unit, determining whether the power capacity is less than a default capacity; and
   if the power capacity is less than the default capacity, then the data management unit configures a service power during a blackout for the at least one cabinet.

10. The electricity management method as claimed in claim 9, wherein the testing instruction includes a service power, and the at least one cabinet is operated with the service power.

11. The electricity management method as claimed in claim 10, wherein the testing instruction further includes a termination condition, the at least one control unit functions according to the termination condition to control the at least one power switch to turn on the external power supply to power the at least one cabinet instead of the at least one uninterruptible power supply apparatus.

12. The electricity management method as claimed in claim 11, wherein the termination condition includes whether the operation voltage of the at least one uninterruptible power supply apparatus is lower than a default voltage, whether the operation time of the at least one uninterruptible power supply apparatus exceeds a default time or whether the amount of power supplied by the at least one uninterruptible power supply apparatus exceeds a default value of power supplied.

13. The electricity management method as claimed in claim 8, wherein the set of battery parameters includes voltage data, electric current data, and temperature data.

14. The electricity management method as claimed in claim 8, wherein the electronic equipment can be at least one hard disc, at least one server or a combination of at least one hard disc and at least one server.

* * * * *